(12) United States Patent
Sirinorakul

(10) Patent No.: US 9,006,034 B1
(45) Date of Patent: Apr. 14, 2015

(54) POST-MOLD FOR SEMICONDUCTOR PACKAGE HAVING EXPOSED TRACES

(71) Applicant: Saravuth Sirinorakul, Bangkok (TH)

(72) Inventor: Saravuth Sirinorakul, Bangkok (TH)

(73) Assignee: UTAC Thai Limited, Bangkok (TH)

( * ) Notice: Subject to any disclaimer, the term of this patent is extended or adjusted under 35 U.S.C. 154(b) by 118 days.

(21) Appl. No.: 13/689,566

(22) Filed: Nov. 29, 2012

Related U.S. Application Data

(60) Provisional application No. 61/658,358, filed on Jun. 11, 2012.

(51) Int. Cl.
 *H01L 23/31* (2006.01)
 *H01L 21/56* (2006.01)
 *H01L 21/48* (2006.01)

(52) U.S. Cl.
 CPC .......... *H01L 21/565* (2013.01); *H01L 23/3157* (2013.01); *H01L 21/4814* (2013.01); *H01L 21/563* (2013.01)

(58) Field of Classification Search
 CPC ............ H01L 21/4814; H01L 21/4885; H01L 21/4889; H01L 25/04
 See application file for complete search history.

(56) References Cited

U.S. PATENT DOCUMENTS

| | | | |
|---|---|---|---|
| 3,611,061 A | 10/1971 | Segerson | |
| 4,411,719 A | 10/1983 | Lindberg | |
| 4,501,960 A | 2/1985 | Jouvet et al. | |
| 4,801,561 A | 1/1989 | Sankhagowit | |
| 4,855,672 A | 8/1989 | Shreeve | |
| 5,105,259 A | 4/1992 | McShane et al. | |
| 5,195,023 A | 3/1993 | Manzione et al. | |
| 5,247,248 A | 9/1993 | Fukunaga | |
| 5,248,075 A | 9/1993 | Young et al. | |
| 5,281,851 A | 1/1994 | Mills et al. | |
| 5,396,185 A | 3/1995 | Honma et al. | |
| 5,397,921 A | 3/1995 | Karnezos | |
| 5,479,105 A | 12/1995 | Kim et al. | |
| 5,535,101 A | 7/1996 | Miles et al. | |
| 5,596,231 A | 1/1997 | Combs | |
| 5,843,808 A | 12/1998 | Karnezos | |
| 5,990,692 A | 11/1999 | Jeong et al. | |
| 6,072,239 A | 6/2000 | Yoneda et al. | |
| 6,111,324 A | 8/2000 | Sheppard et al. | |
| 6,159,770 A | 12/2000 | Tetaka et al. | |
| 6,197,615 B1 | 3/2001 | Song et al. | |
| 6,208,020 B1 | 3/2001 | Minamio et al. | |
| 6,229,200 B1 | 5/2001 | Mclellan et al. | |
| 6,242,281 B1 | 6/2001 | Mclellan et al. | |
| 6,250,841 B1 | 6/2001 | Ledingham | |
| 6,284,569 B1 | 9/2001 | Sheppard et al. | |

(Continued)

OTHER PUBLICATIONS

Office Action mailed on Sep. 16, 2013, U.S. Appl. No. 13/689,531, filed Nov. 29, 2012, et al.

(Continued)

*Primary Examiner* — Cheung Lee
(74) *Attorney, Agent, or Firm* — Haverstock & Owens LLP

(57) ABSTRACT

Method of and devices for protecting semiconductor packages are provided. The methods and devices comprise loading a leadframe containing multiple semiconductor packages into a molding device, adding a molding material on a surface of the leadframe, molding the molding material, such that the molding material covers the entire surface of the semiconductor packages except conducting terminals, and singulating the semiconductor packages from the leadframe after molding the molding material.

12 Claims, 7 Drawing Sheets

(56) References Cited

U.S. PATENT DOCUMENTS

| | | |
|---|---|---|
| 6,285,075 B1 | 9/2001 | Combs et al. |
| 6,294,100 B1 | 9/2001 | Fan et al. |
| 6,304,000 B1 | 10/2001 | Isshiki et al. |
| 6,326,678 B1 | 12/2001 | Karnezos et al. |
| 6,329,711 B1 | 12/2001 | Kawahara et al. |
| 6,353,263 B1 | 3/2002 | Dotta et al. |
| 6,376,921 B1 | 4/2002 | Yoneda et al. |
| 6,384,472 B1 | 5/2002 | Huang |
| 6,392,427 B1 | 5/2002 | Yang |
| 6,414,385 B1 | 7/2002 | Huang et al. |
| 6,429,048 B1 | 8/2002 | McLellan et al. |
| 6,451,709 B1 | 9/2002 | Hembree |
| 6,455,348 B1 | 9/2002 | Yamaguchi |
| 6,476,469 B2 | 11/2002 | Hung et al. |
| 6,489,218 B1 | 12/2002 | Kim et al. |
| 6,498,099 B1 | 12/2002 | McLellan et al. |
| 6,507,116 B1 | 1/2003 | Caletka et al. |
| 6,545,332 B2 | 4/2003 | Huang |
| 6,545,347 B2 | 4/2003 | McClellan |
| 6,552,417 B2 | 4/2003 | Combs |
| 6,552,423 B2 | 4/2003 | Song et al. |
| 6,566,740 B2 | 5/2003 | Yasunaga et al. |
| 6,573,121 B2 | 6/2003 | Yoneda et al. |
| 6,585,905 B1 | 7/2003 | Fan et al. |
| 6,586,834 B1 | 7/2003 | Sze et al. |
| 6,635,957 B2 | 10/2003 | Kwan et al. |
| 6,669,191 B2 | 12/2003 | Lee |
| 6,683,368 B1 | 1/2004 | Mostafazadeh |
| 6,686,667 B2 | 2/2004 | Chen et al. |
| 6,703,696 B2 | 3/2004 | Ikenaga et al. |
| 6,723,585 B1 | 4/2004 | Tu et al. |
| 6,724,071 B2 | 4/2004 | Combs |
| 6,734,044 B1 | 5/2004 | Lin et al. |
| 6,734,552 B2 | 5/2004 | Combs et al. |
| 6,737,755 B1 | 5/2004 | McLellan et al. |
| 6,764,880 B2 | 7/2004 | Wu et al. |
| 6,781,242 B1 | 8/2004 | Fan et al. |
| 6,800,948 B1 | 10/2004 | Yeung et al. |
| 6,812,552 B2 | 11/2004 | Islam et al. |
| 6,818,472 B1 | 11/2004 | Fan et al. |
| 6,818,978 B1 | 11/2004 | Fan |
| 6,818,980 B1 | 11/2004 | Pedron, Jr. |
| 6,841,859 B1 | 1/2005 | Thamby et al. |
| 6,876,066 B2 | 4/2005 | Fee et al. |
| 6,894,376 B1 | 5/2005 | Mostafazadeh et al. |
| 6,897,428 B2 | 5/2005 | Minamio et al. |
| 6,927,483 B1 | 8/2005 | Lee et al. |
| 6,933,176 B1 | 8/2005 | Kirloskar et al. |
| 6,933,594 B2 | 8/2005 | McLellan et al. |
| 6,940,154 B2 | 9/2005 | Pedron et al. |
| 6,946,324 B1 | 9/2005 | McLellan et al. |
| 6,964,918 B1 | 11/2005 | Fan et al. |
| 6,967,126 B2 | 11/2005 | Lee et al. |
| 6,979,594 B1 | 12/2005 | Fan et al. |
| 6,982,491 B1 | 1/2006 | Fan et al. |
| 6,984,785 B1 | 1/2006 | Diao et al. |
| 6,989,294 B1 | 1/2006 | McLellan et al. |
| 6,995,460 B1 | 2/2006 | McLellan et al. |
| 7,008,825 B1 | 3/2006 | Bancod et al. |
| 7,009,286 B1 | 3/2006 | Kirloskar et al. |
| 7,049,177 B1 | 5/2006 | Fan et al. |
| 7,060,535 B1 | 6/2006 | Sirinorakul et al. |
| 7,071,545 B1 | 7/2006 | Patel et al. |
| 7,091,581 B1 | 8/2006 | McLellan et al. |
| 7,101,210 B2 | 9/2006 | Lin et al. |
| 7,102,210 B2 | 9/2006 | Ichikawa |
| 7,205,178 B2 | 4/2007 | Shiu et al. |
| 7,224,048 B1 | 5/2007 | McLellan et al. |
| 7,247,526 B1 | 7/2007 | Fan et al. |
| 7,259,678 B2 | 8/2007 | Brown et al. |
| 7,274,088 B2 | 9/2007 | Wu et al. |
| 7,314,820 B2 | 1/2008 | Lin et al. |
| 7,315,077 B2 | 1/2008 | Choi et al. |
| 7,315,080 B1 | 1/2008 | Fan et al. |
| 7,342,305 B1 | 3/2008 | Diao et al. |
| 7,344,920 B1 | 3/2008 | Kirloskar et al. |
| 7,348,663 B1 | 3/2008 | Kirloskar et al. |
| 7,358,119 B2 | 4/2008 | McLellan et al. |
| 7,371,610 B1 | 5/2008 | Fan et al. |
| 7,372,151 B1 | 5/2008 | Fan et al. |
| 7,381,588 B1 | 6/2008 | Patel et al. |
| 7,399,658 B2 | 7/2008 | Shim et al. |
| 7,408,251 B2 | 8/2008 | Hata et al. |
| 7,411,289 B1 | 8/2008 | McLellan et al. |
| 7,449,771 B1 | 11/2008 | Fan et al. |
| 7,482,690 B1 | 1/2009 | Fan et al. |
| 7,495,319 B2 | 2/2009 | Fukuda et al. |
| 7,595,225 B1 | 9/2009 | Fan et al. |
| 7,608,484 B2 | 10/2009 | Lange et al. |
| 7,709,857 B2 | 5/2010 | Kim et al. |
| 7,714,418 B2 | 5/2010 | Lim et al. |
| 2001/0007285 A1 | 7/2001 | Yamada et al. |
| 2002/0109214 A1 | 8/2002 | Minamio et al. |
| 2003/0006055 A1 | 1/2003 | Chien-Hung et al. |
| 2003/0045032 A1 | 3/2003 | Abe |
| 2003/0071333 A1 | 4/2003 | Matsuzawa |
| 2003/0143776 A1 | 7/2003 | Pedron, Jr. et al. |
| 2003/0178719 A1 | 9/2003 | Combs et al. |
| 2003/0201520 A1 | 10/2003 | Knapp et al. |
| 2003/0207498 A1 | 11/2003 | Islam et al. |
| 2003/0234454 A1 | 12/2003 | Pedron et al. |
| 2004/0014257 A1 | 1/2004 | Kim et al. |
| 2004/0026773 A1 | 2/2004 | Koon et al. |
| 2004/0046237 A1 | 3/2004 | Abe et al. |
| 2004/0046241 A1 | 3/2004 | Combs et al. |
| 2004/0070055 A1 | 4/2004 | Punzalan et al. |
| 2004/0080025 A1 | 4/2004 | Kasahara et al. |
| 2004/0110319 A1 | 6/2004 | Fukutomi et al. |
| 2005/0003586 A1 | 1/2005 | Shimanuki et al. |
| 2005/0077613 A1 | 4/2005 | McLellan et al. |
| 2005/0236701 A1 | 10/2005 | Minamio et al. |
| 2005/0263864 A1 | 12/2005 | Islam et al. |
| 2006/0071351 A1 | 4/2006 | Lange |
| 2006/0192295 A1 | 8/2006 | Lee et al. |
| 2006/0223229 A1 | 10/2006 | Kirloskar et al. |
| 2006/0223237 A1 | 10/2006 | Combs et al. |
| 2006/0273433 A1 | 12/2006 | Itou et al. |
| 2007/0001278 A1 | 1/2007 | Jeon et al. |
| 2007/0013038 A1 | 1/2007 | Yang |
| 2007/0029540 A1 | 2/2007 | Kajiwara et al. |
| 2007/0093000 A1 | 4/2007 | Shim et al. |
| 2007/0200210 A1 | 8/2007 | Zhao et al. |
| 2007/0235217 A1 | 10/2007 | Workman |
| 2008/0048308 A1 | 2/2008 | Lam |
| 2008/0150094 A1 | 6/2008 | Anderson |
| 2009/0152694 A1 | 6/2009 | Bemmerl et al. |
| 2009/0230525 A1 | 9/2009 | Cahng Chien et al. |
| 2009/0236713 A1 | 9/2009 | Xu et al. |
| 2010/0133565 A1 | 6/2010 | Cho et al. |
| 2010/0149773 A1 | 6/2010 | Said |
| 2010/0178734 A1 | 7/2010 | Lin |
| 2010/0224971 A1 | 9/2010 | Li |
| 2011/0115061 A1 | 5/2011 | Krishnan et al. |
| 2011/0201159 A1 | 8/2011 | Mori et al. |
| 2012/0178214 A1* | 7/2012 | Lam .............................. 438/118 |

OTHER PUBLICATIONS

Michael Quirk and Julian Serda, Semiconductor Manufacturing Technology, Pearson Education International, Pearson Prentice Hall, 2001, pp. 587-588.

Office Action mailed on Dec. 20, 2013, U.S. Appl. No. 13/689,531, filed Nov. 29, 2012, Saravuth Sirinorakul et al.

* cited by examiner

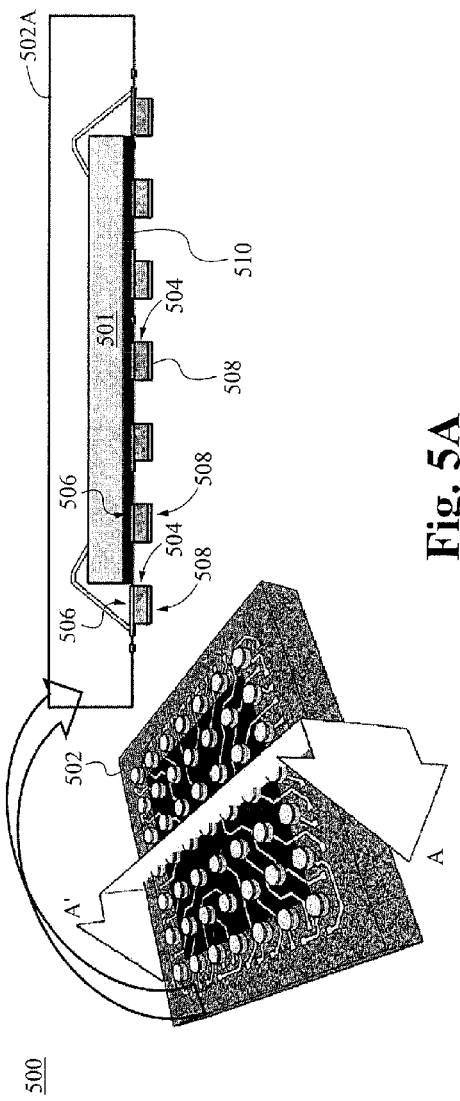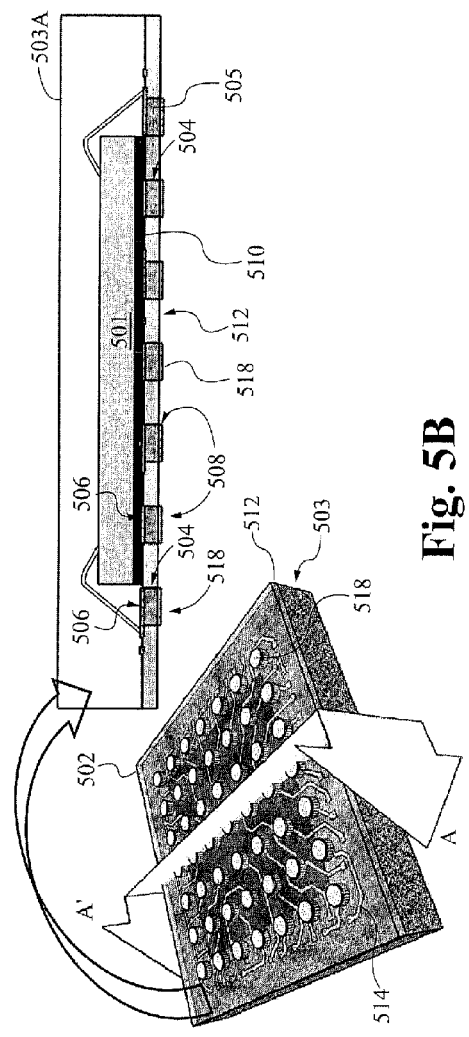
Fig. 5A
Fig. 5B

POST-MOLD FOR SEMICONDUCTOR PACKAGE HAVING EXPOSED TRACES

CROSS-REFERENCE TO RELATED APPLICATION(S)

This application claims benefit of priority under 35 U.S.C. section 119(e) of the U.S. Provisional Patent Application Ser. No. 61/658,358, filed Jun. 11, 2012, entitled "POST-MOLD CONCEPT FOR SEMICONDUCTOR PACKAGE HAVING EXPOSED TRACES," which is hereby incorporated by reference in its entireties.

FIELD OF THE INVENTION

The present invention relates to semiconductor packaging. More particularly, the present invention relates to contamination prevention of semiconductor packages.

BACKGROUND

The bottom side of a typical semiconductor package contains conductive traces and protruding terminals in order to make contacts with printed circuit boards (PCB). The protruding terminals and conductive traces are exposed and likely to be contaminated. The contamination can cause electrical shorts between exposed traces.

FIG. 1 illustrates a typical semiconductor package 100 with exposed traces. The bottom view 102 of the semiconductor package 100 shows exposed traces 106 and protruding terminals 108. Cross sectional views 104A and 104B show the views along lines A-A' and B-B' of the bottom view 102 respectively. View 104L shows a wire bond version of the cross sectional views 104A and 104B. View 104R shows a flip chip version of the cross sectional views 104A and 104B. As shown in the views 104L and 104R, both traces 106 and protruding terminals 108 are exposed and can be contaminated in a manner to cause shorts.

SUMMARY OF THE INVENTION

Methods of and devices for semiconductor circuit protection are disclosed. In the first aspect, a leadframe panel comprises one or more semiconductor packages on the leadframe panel, wherein each of the one or more semiconductor packages comprises at least one conductive trace and at least one conductive terminal, and a protective layer covering the at least one conductive trace. In some embodiments, the at least one conductive terminal is exposed. In other embodiments, the at least one conductive terminal is covered by a material. In some other embodiments, the material comprises a conductive material. In some embodiments, the material comprises a solder bump. In other embodiments, the protective layer covers substantially all of the surface of the leadframe panel except the at least one conductive terminal. In some other embodiments, the protective layer comprises an insulating material. In some embodiments, the insulating material comprises an electrical insulating material.

In the second aspect, a semiconductor package comprises a surface and a protective layer. The surface has at least one conductive trace and at least one conductive terminal. The protective layer covers substantial all of the surface and the at least one conductive trace. The at least one conductive terminal protrudes beyond the protective layer. In some embodiments, the at least one conductive terminal remains exposed. In other embodiments, the protective layer covers at least one conductive trace entirely. In some other embodiments, the at least one conductive trace is exposed at a side of the protective layer. In some embodiments, the conductive terminal couples with a plating material. In other embodiments, the protective layer covers substantially all of the conductive terminal except the plating material. In some other embodiments, the conductive terminal is covered by a solder material.

In the third aspect, a method of forming a protective layer on semiconductor packages comprises adding a molding material on a surface of the semiconductor packages on a leadframe, selectively covering a first conductive member with the molding material by using a molding device, such that the first conductive member becomes a protected first conductive member, preventing the molding material from covering a second conductive member; and forming a protective surface covering substantial all of the surface of the semiconductor packages. In some embodiments, the first conductive member comprises a metal trace. In other embodiments, the second conductive member comprises a conductive terminal. In some other embodiments, the conductive terminal protrudes beyond a surface of an average thickness of the first conductive member. In some embodiments, the method further comprises a substantial planar surface comprising a contacting surface of the conductive terminal and the protective surface. In other embodiments, the method further comprises adding a solder material on the conductive terminal, thereby covering the conductive terminal. In some other embodiments, the solder material comprises a solder bump. In some embodiments, the method further comprises plating a plating material on the conductive terminal, wherein the plating material is different from a material of the conductive terminal. In other embodiments, the plating material sandwiches the conductive terminal. In some other embodiments, the method further comprises covering the first conductive member at a side of the protective surface. In some embodiments, the method further comprises leaving the first conductive member exposed at a side of the protective surface. In other embodiments, the method further comprises singulating the semiconductor packages after forming the protective surface.

In the fourth aspect, a method of protecting a semiconductor package comprising loading a leadframe containing multiple semiconductor packages into a molding device, adding a molding material on a surface of the leadframe, molding the molding material, such that the molding material covers the entire surface of the semiconductor packages except conducting terminals, and singulating the semiconductor packages from the leadframe after molding the molding material.

BRIEF DESCRIPTION OF THE DRAWINGS

The accompanying drawings, which are incorporated in and form a part of this specification, illustrate embodiments of the invention and, together with the description, serve to explain the principles of the invention, but not limit the invention to the disclosed examples.

FIGS. 5A and 5B illustrate a two side plating semiconductor package in accordance with some embodiments of the present invention.

The present invention is described relative to the several views of the drawings. Where appropriate and only where identical elements are disclosed and shown in more than one drawing, the same reference numeral will be used to represent such identical elements.

DETAILED DESCRIPTION OF THE PRESENT INVENTION

Reference will now be made in detail to the embodiments of the conductive circuit protection method and apparatus of the invention, examples of which are illustrated in the accompanying drawings. While the invention will be described in conjunction with the embodiments below, it will be understood that they are not intended to limit the invention to these embodiments and examples. On the contrary, the invention is intended to cover alternatives, modifications and equivalents, which may be included within the spirit and scope of the invention as defined by the appended claims. Furthermore, in the following detailed description of the present invention, numerous specific details are set forth in order to more fully illustrate the present invention. However, it will be apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It will, of course, be appreciated that in the development of any such actual implementation, numerous implementation-specific decisions must be made in order to achieve the developer's specific goals, such as compliance with application and business related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

Figure 2:
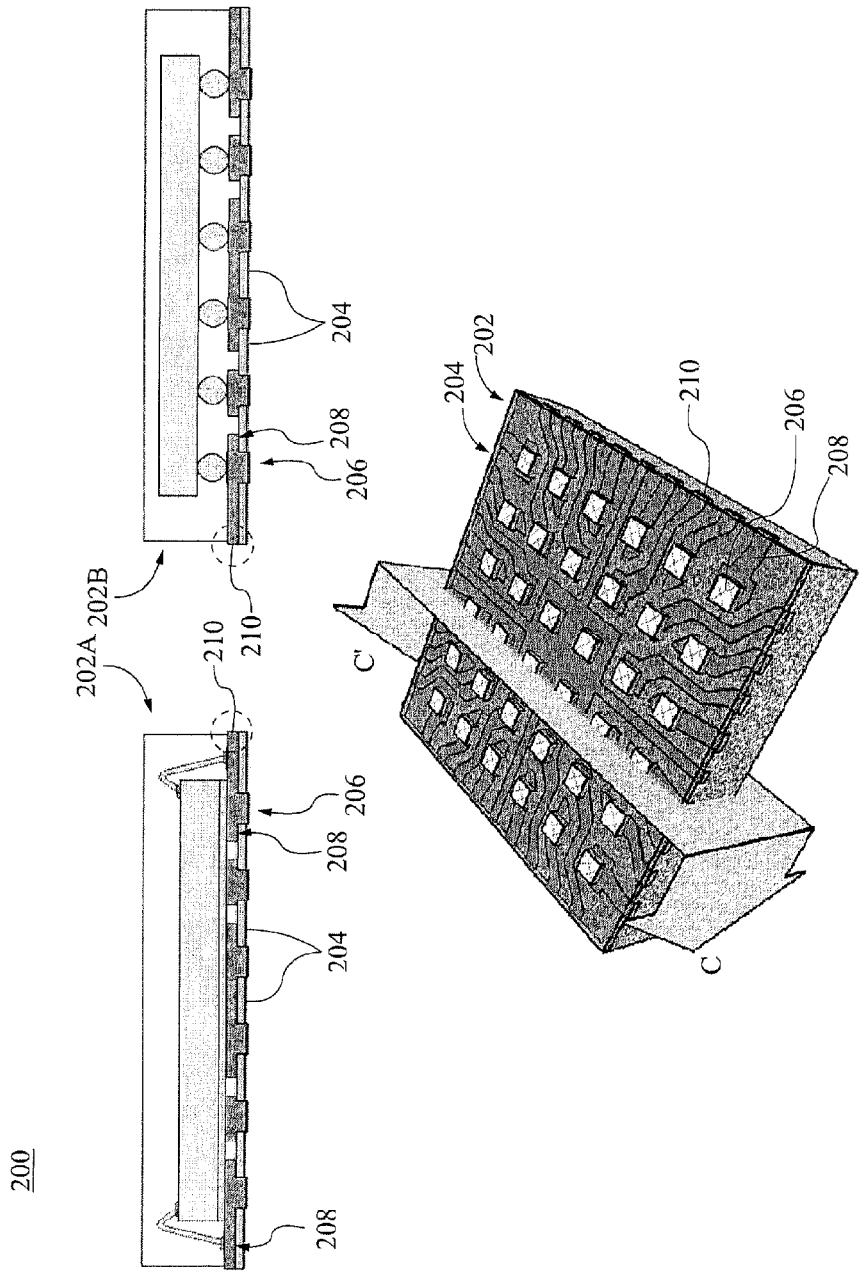
FIG. 2 illustrates a side conductive member exposed semiconductor package in accordance with some embodiments of the present invention.

In general, a leadframe array includes conductive traces, and rayed contact terminals. A semiconductor package is coupled to the lead frame mechanically and electronically in the usual manner. The leadframe array is partially molded to encapsulate the semiconductor die. Thereafter, the partially mold leadframe is a mold chase. The mold chase is configured to contact a surface of the raised contact terminals. The cavity of the mold chase is injected with a material to cover the conductive traces. Because the mold chase contacts the raised contact terminals those surfaces are exposed when the leadframe array is removed from the mold chase. In the following, FIG. 2 illustrates a side conductive member exposed semiconductor package 200 in accordance with some embodiments of the present invention. Cross sectional views 202A and 202B are taken along the line of C-C'. Views 202A and 202B are cross sectional views of a wire bond version and a flip chip version respectively. The semiconductor package 202 is able to be singulated from a panel of a silicon wafer containing multiple semiconductor packages after the protection layer 204 is formed. In some embodiments, the protection layer 204 comprises an insulating material forming an insulating layer. The insulating material is able to be coated to cover the traces 208. The protective layer 204 is able to cover the whole bottom side of the semiconductor packages 202 except the plated stud terminals (conductive terminals) 206. In some embodiments, the side conductive members 210 are exposed and are not covered/protected by the protective layer 204.

The protective layer 204 is able to be coated/applied before the singulation process, such that the protective layer can be applied to cover multiple semiconductor packages concurrently. The protective layer 204 is able to comprise a material of high dielectric constant (insulating materials), a water proof material, a physical impact resistant material, a heat resistant material, or a combination thereof.

Figure 3:
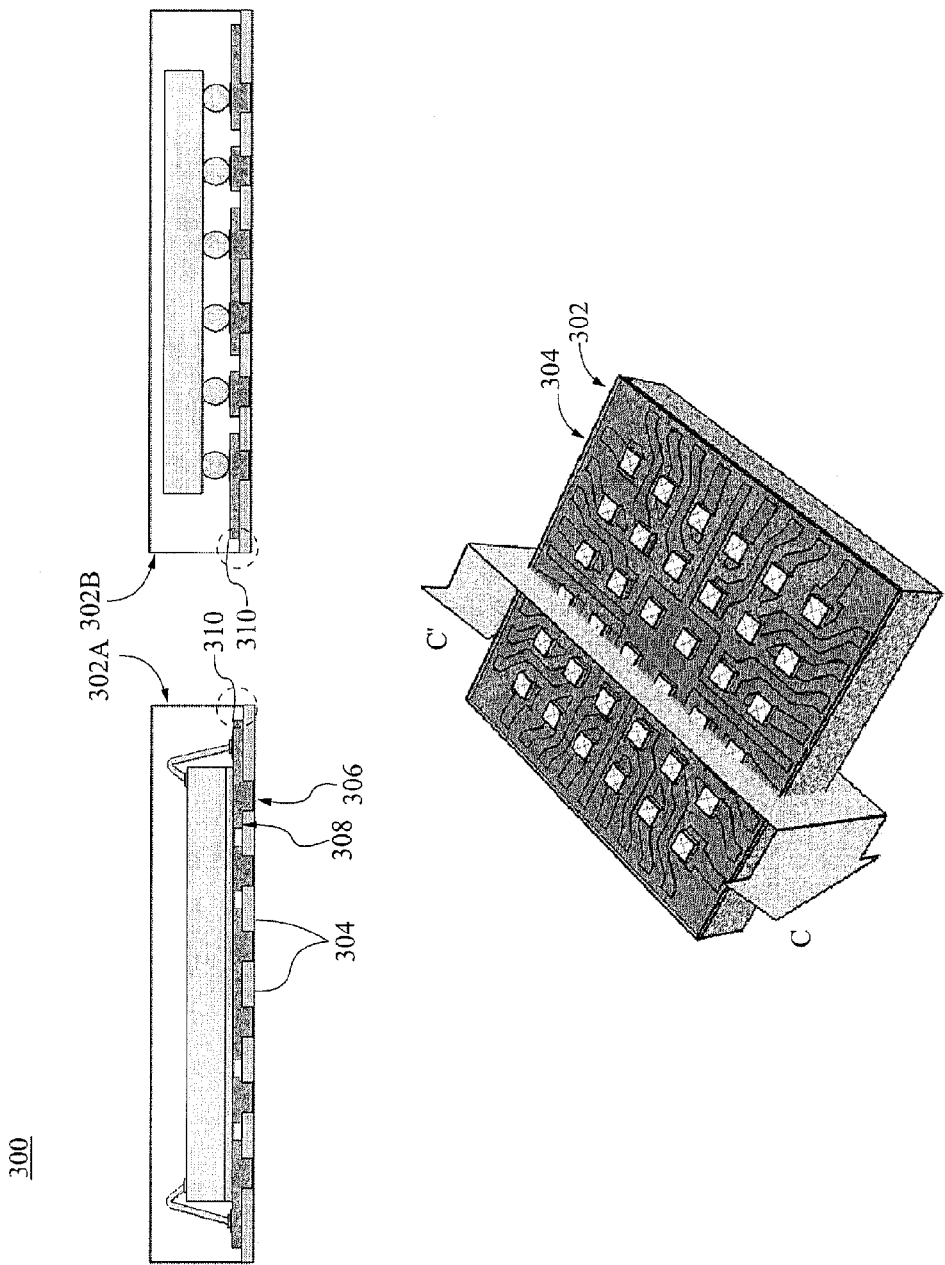
FIG. 3 illustrates a side conductive member covered semiconductor package in accordance with some embodiments of the present invention.
Figure 4:
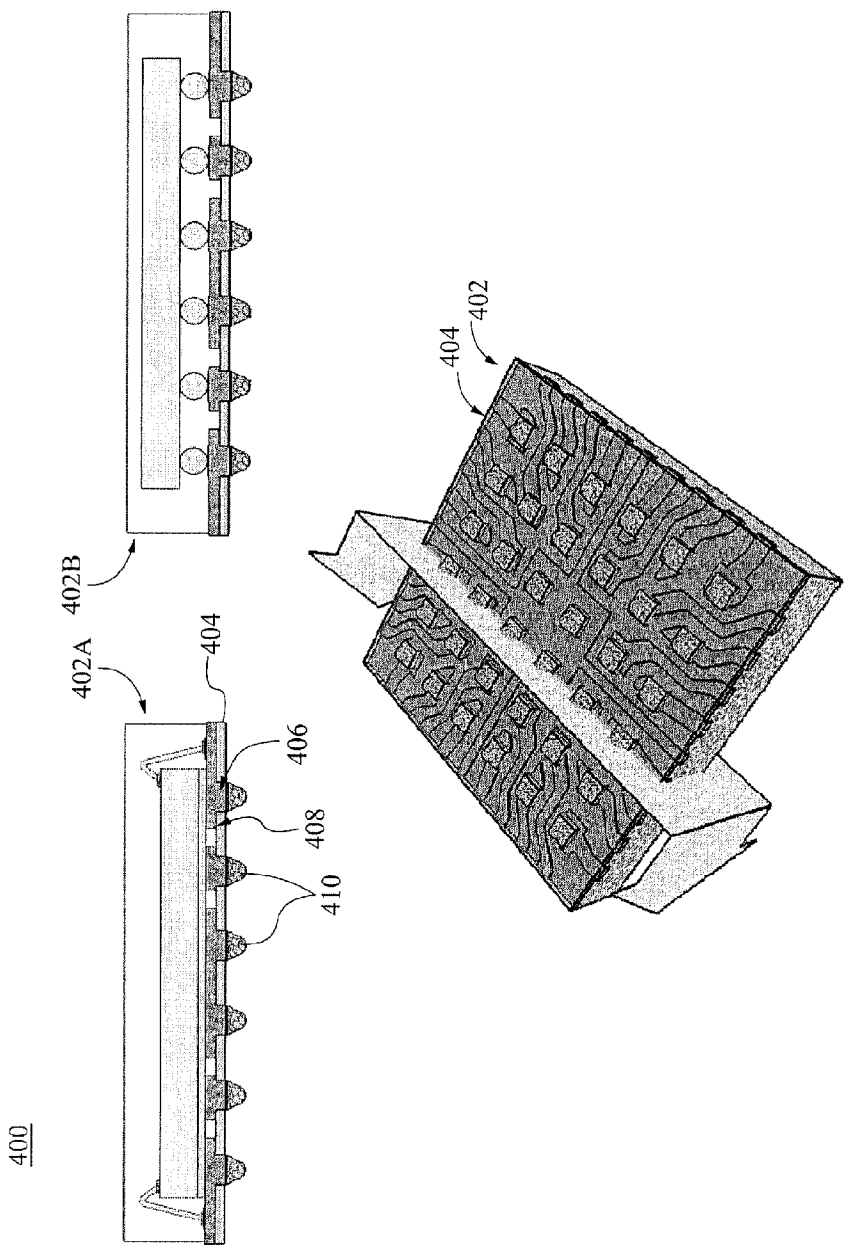
FIG. 4 illustrates a conductive terminal covered semiconductor package in accordance with some embodiments of the present invention.

FIG. 3 illustrates a side conductive member covered semiconductor package 300 in accordance with some embodiments of the present invention. Views 302A and 302B illustrate the wire bond version and the flip chip version of the semiconductor package 302, respectively. Similar to the construction of the semiconductor package 200 (FIG. 2), the semiconductor package 302 comprises an insulating layer 304. The insulating layer 304 covers the conductive traces 308 while leaving the conductive terminals 306 not to be covered. Different from the exposed side conductive members 210 (FIG. 2), the side conductive members 310 that are near the edge of the semiconductor packages 302 are covered and not exposed. FIG. 4 illustrates a conductive terminal covered semiconductor package 400 in accordance with some embodiments of the present invention. In some embodiments, the bottom side of a semiconductor package 402 is able to be covered fully, including the conductive traces 408, by a first protective layer 404. The first protective layer 404 is able to designed to avoid covering the conductive terminals 406. A second protective layer 410 is able to be formed on the conductive terminals 406. The first and second protective layers 404 and 410 form a complete cover sealing the entire bottom side of the semiconductor packages 402. The second protective layer 410 is able to be formed by placing solder bump balls on the conductive terminals 406. In some embodiments, the second protective layer 410 is a conductive material. The second protective layer 410 is able to be formed by screen printing, a solder ball dropping, or a combination thereof.

FIGS. 5A and 5B illustrate a two side plating semiconductor package 500 in accordance with some embodiments of the present invention. As shown in FIG. 5A, view 502A is a cross sectional view A-A' of the chip 502. In some embodiments, the package 500 comprises top plating 506, protruding members 504, and bottom plating 508 in sequence. The top plating 506 are able to couple with the epoxy 510, which can be used for die attachment to the substrate 501.

Referring to FIG. 5B, views 503A is a cross sectional view A-A' of the semiconductor packages 503. In some embodiments, a protective layer 512 is able to be applied to cover substantial all of the surface of the semiconductor packages 503, including the conductive traces 514, except the protruding terminals 518. In some embodiments, the protective layer 512 covers substantial all of the side of the protruding terminals 518 (e.g., including top plating 506 and protruding members 504) leaving only bottom plating 508 exposed. A person of ordinary skill in the art appreciates that the protective layer 512 is able to be any thicknesses. For example, the protective layer is able to cover a portion of the protruding members 504 (e.g., ½, of the whole protruding member 505) leaving a portion of the protruding members 504 exposed.

Figure 6A:
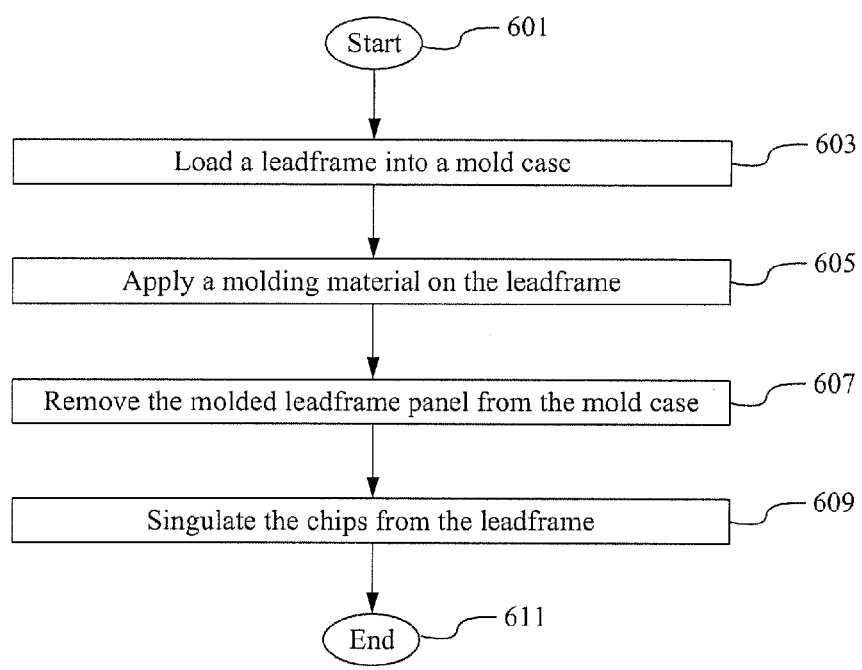
FIG. 6A is a flow chart illustrating a protective layer forming method in accordance with some embodiments of the present invention.

FIG. 6A is a flow chart illustrating a protective layer forming method 600 in accordance with some embodiments. FIG.

Figure 1:
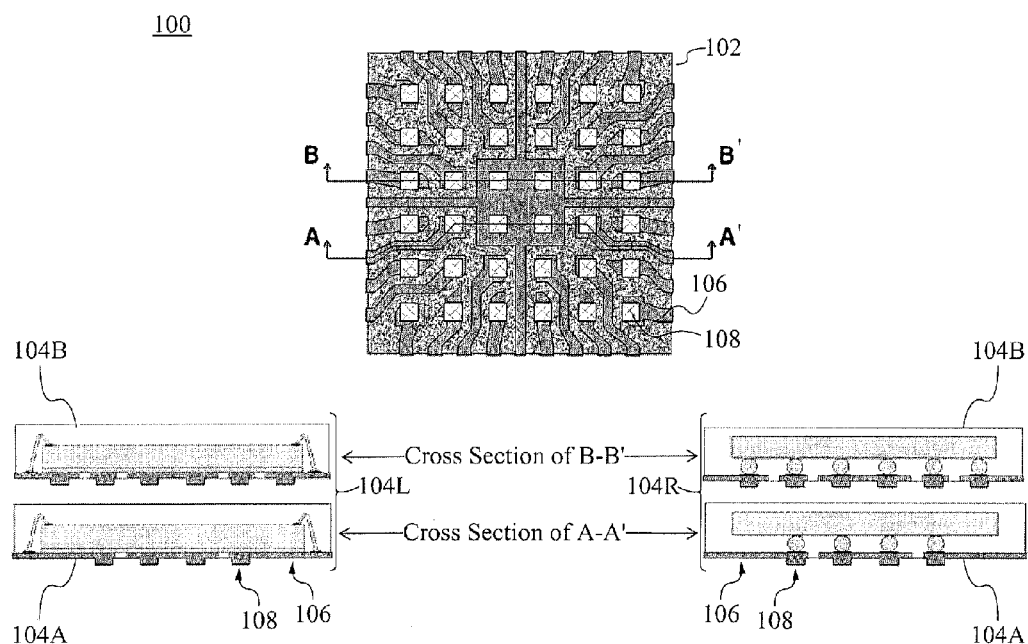
FIG. 1 illustrates a typical semiconductor package with exposed traces.
Figure 6B:
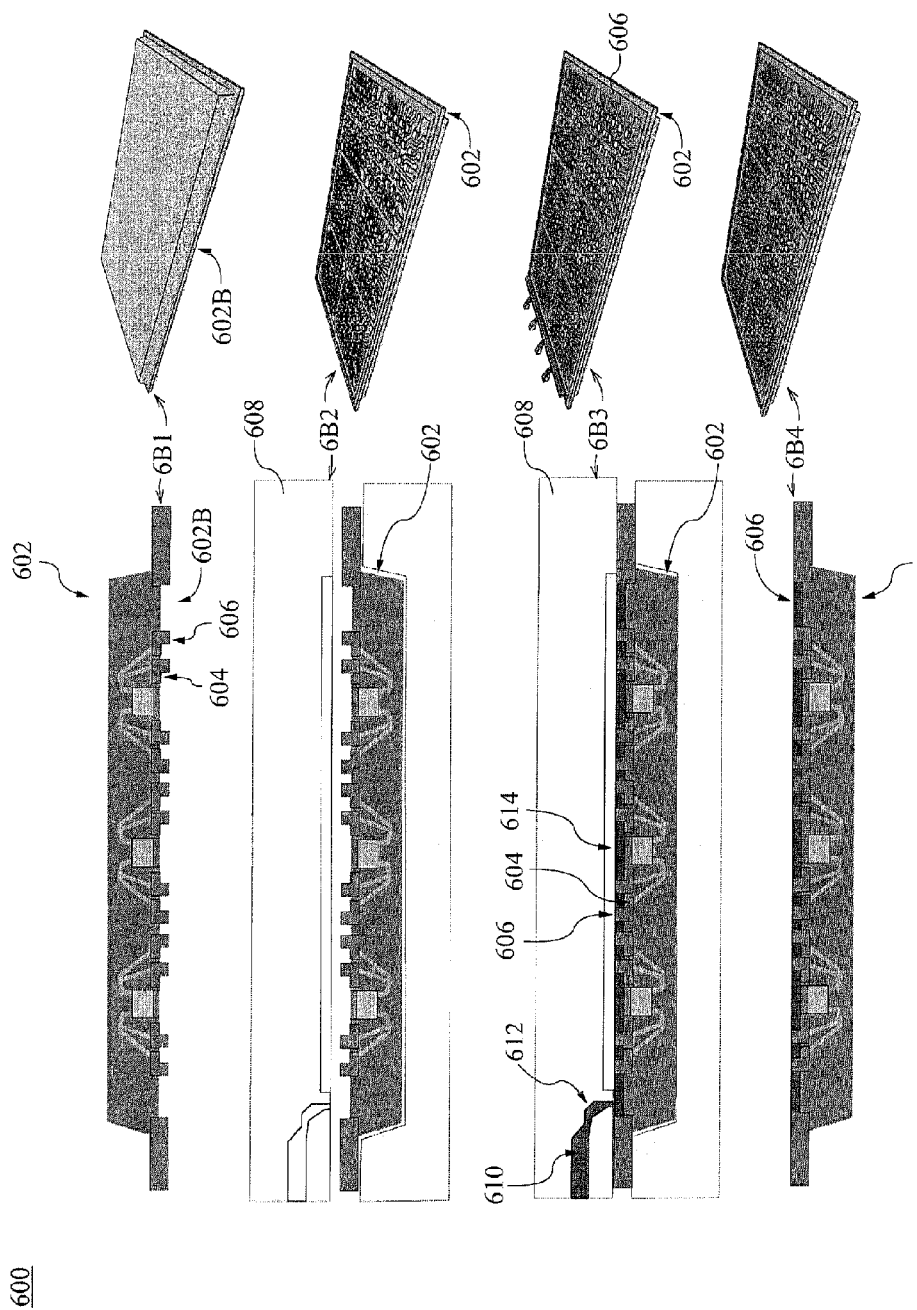
FIG. 6B illustrates a protective layer forming process in accordance with some embodiments of the present invention.

6B illustrates a protective layer forming process 600 in accordance with some embodiments. FIG. 6B is able to be read in conjunction with the flow chart of FIG. 6A. The method 600 is able to start at Step 601. As shown in FIG. 6B-1, the bottom side 602B of the leadframe panel 602 that contains conductive traces 604 and conductive terminals 606 are exposed. At Step 603 (FIG. 6B2), a leadframe panel 602 is loaded into a mold case 608 for forming a protective layer. At Step 605 (FIG. 6B3), a molding material 610 from the molding material supplying port 612 is applied on the leadframe panel 602. The molding material 610 is molded to form a protective layer 614 covering the exposed traces 604 and leaving the conductive terminals 606 not to be covered. At Step 607 (FIG. 6B4), the leadframe panel 602 with the molded molding material 614 is removed from the mold case 608. At Step 609, single unit semiconductor packages are singulated and isolated from the leadframe panel.

The process and devices described herein can be utilized in forming protective layers for semiconductor packages. In operation, a molding material is able to be applied to a leadframe panel covering the exposed traces and leaving the conductive terminals not to be covered. In some embodiments, the covering material on the conductive terminals is able to be conductive materials (i.e., solder bump) such that the conductive terminals are able to be covered while maintaining its conductive property.

The present invention has been described in terms of specific embodiments incorporating details to facilitate the understanding of the principles of construction and operation of the invention. The specific configurations shown in relation to the various modules and the interconnections therebetween are for exemplary purposes only. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. A method of forming a protective layer on partially molded semiconductor packages comprising:
   a. adding a molding material on a surface of the semiconductor packages on a leadframe;
   b. selectively covering a first conductive member with the molding material by using a molding device, such that the first conductive member becomes a protected first conductive member;
   c. preventing the molding material from covering at least one conductive terminal by making a contact of a mold chase with a bottom side of the at least one conductive terminal while the molding material is applied to one or more cavities between the mold chase and the first conductive member; and
   d. forming a protective surface covering substantial all of the surface of the semiconductor packages.

2. The method of claim 1, wherein the first conductive member comprises a metal trace.

3. The method of claim 1, wherein the conductive terminal protrudes beyond a surface of an average thickness of the first conductive member.

4. The method of claim 1, further comprising a substantial planar surface including both a contacting surface of the conductive terminal and the protective surface.

5. The method of claim 1, further comprising adding a solder material on the conductive terminal, thereby covering the conductive terminal.

6. The method of claim 5, wherein the solder material comprises a solder bump.

7. The method of claim 1, further comprising plating a plating material on the conductive terminal, wherein the plating material is different from a material of the conductive terminal.

8. The method of claim 7, wherein the plating material sandwiches the conductive terminal.

9. The method of claim 1, further comprising covering the first conductive member at a side of the protective surface.

10. The method of claim 1, further comprising leaving the first conductive member exposed at a side of the protective surface.

11. The method of claim 1, further comprising singulating the semiconductor packages after forming the protective surface.

12. A method of protecting a semiconductor package comprising:
   a. loading a leadframe containing multiple partially molded semiconductor packages into a molding device;
   b. adding a molding material on a surface of the leadframe;
   c. molding the molding material and making a contact between a conducting terminal and a mold chase, such that the molding material covers the entire surface of the semiconductor packages except conducting terminals; and
   d. singulating the semiconductor packages from the leadframe after molding the molding material.

* * * * *